US010044350B1

(12) United States Patent
Ribarich et al.

(10) Patent No.: US 10,044,350 B1
(45) Date of Patent: Aug. 7, 2018

(54) POWER FET DRIVER

(71) Applicant: Navitas Semiconductor, Inc., El Segundo, CA (US)

(72) Inventors: Thomas Ribarich, Laguna Beach, CA (US); Ju Zhang, Monterey Park, CA (US)

(73) Assignee: Navitas Semiconductor, Inc., El Segundo, CA (US)

( * ) Notice: Subject to any disclaimer, the term of this patent is extended or adjusted under 35 U.S.C. 154(b) by 0 days.

(21) Appl. No.: 15/700,039

(22) Filed: Sep. 8, 2017

Related U.S. Application Data

(60) Provisional application No. 62/511,039, filed on May 25, 2017.

(51) Int. Cl.
*H02M 7/217* (2006.01)
*H03K 17/082* (2006.01)
*H03K 17/691* (2006.01)
*H03K 17/06* (2006.01)
*H03K 9/08* (2006.01)
*H03K 17/62* (2006.01)

(52) U.S. Cl.
CPC ........ *H03K 17/0822* (2013.01); *H02M 7/217* (2013.01); *H03K 9/08* (2013.01); *H03K 17/063* (2013.01); *H03K 17/6235* (2013.01); *H03K 17/691* (2013.01)

(58) Field of Classification Search
None
See application file for complete search history.

(56) References Cited

U.S. PATENT DOCUMENTS

| 4,511,815 | A | | 4/1985 | Wood | |
|---|---|---|---|---|---|
| 5,786,687 | A | * | 7/1998 | Faulk | H02M 3/155 323/289 |
| 6,144,193 | A | | 11/2000 | Illingworth | |
| 2007/0109817 | A1 | * | 5/2007 | Shimura | H02M 1/08 363/16 |

(Continued)

OTHER PUBLICATIONS

Daizhuang Wang, et al., "Design and Simulation of Gate Driver Circuit Using Pulse Transformer," Clean Energy Automotive Engineering, Tongji University, Shanhai, IJCSI International Journal of Computer Science, Issues, vol. 10, Issue 2, No. 2, dated Mar. 2013.

(Continued)

*Primary Examiner* — Jeffrey Gblende
(74) *Attorney, Agent, or Firm* — Kilpatrick Townsend

(57) ABSTRACT

A power drive circuit is disclosed. The power circuit includes: a pulse detector, configured to generate first and second control signals in response to first and second pulse signals, respectively. The power drive circuit also includes a state storage device, configured to generate first and second driver input signals in response to the first and second control signals, respectively. The power drive circuit also includes a driver configured to generate first and second gate drive signals in response to the first and second driver input signals, respectively. The power drive circuit also includes a power switch, configured to receive the first and second gate drive signals, where the first and second gate drive signals control the power switch to selectively conduct or not conduct current between first and second terminals.

18 Claims, 9 Drawing Sheets

(56) References Cited

U.S. PATENT DOCUMENTS

| | | | | |
|---|---|---|---|---|
| 2010/0328831 A1* | 12/2010 | Zhang | ................... | H02H 7/1213 |
| | | | | 361/93.1 |
| 2012/0320637 A1* | 12/2012 | Kyono | ................... | H02M 3/337 |
| | | | | 363/21.02 |
| 2015/0381065 A1* | 12/2015 | Yonezawa | ............ | H02M 3/3378 |
| | | | | 363/25 |
| 2016/0099647 A1* | 4/2016 | Zhang | ............... | H02M 3/33569 |
| | | | | 363/21.12 |
| 2016/0173068 A1* | 6/2016 | Kim | ..................... | H03K 17/687 |
| | | | | 327/109 |

OTHER PUBLICATIONS

Internal Power Point Presentation on or about Mar. 7, 2017 regarding "Datasheet Archive, International Rectifier—Technical Information—Gate Drive" in 1 page.

Kota, Pratibha, "Analysis and Design Methodology for PCB and Integrated Circuit Pulse Transformer," Bachelor of Technology in Electrical and Electronics Engineering, Jawaharlal Nehru Technological University, Andhra Pradesh, India (2005).

Garcia, Jorge, et al., "Impulse Transformer Based Secondary-Side Self-Powered Gate-Driver for Wide-Range PWM Operation of SiC Power MOSFETs."

Balogh, Laszlo, "Design and Application Guide for High Speed MOSFET Gate Drive Circuits."

\* cited by examiner

US 10,044,350 B1

POWER FET DRIVER

CROSS-REFERENCES TO RELATED APPLICATIONS

This application claims the benefit of U.S. Provisional Patent Application No. 62/511,039, filed May 25, 2017, titled "GAN FET WITH INTEGRATED PULSE DETECTION CIRCUIT," the content of which is incorporated herein by reference in its entirety for all purposes.

FIELD OF THE INVENTION

The described embodiments relate generally to gallium-nitride semiconductors, and more particularly to a power switch controlled by an pulse detection circuit.

BACKGROUND OF THE INVENTION

Integrated circuits exist today that include a GaN power FET together with a gate driver and are available in a single monolithic package. This allows for a standard PWM signal (from a micro-controller or PWM controller IC) to be used as a simple input for turning the power FET on and off. These products, such as that illustrated in FIG. 1, include a VCC supply pin, a PWM gate drive input, a VDD supply pin, a DZ Zener reference pin, the power FET drain connection, and the power FET source connection. The connection between the gate drive output and the gate connection of the power FET is internal. This configuration is a tremendous breakthrough invention for the field of power electronics and helps to solve the fundamental problems of noise and transient immunity for a GaN power FET operating under high-frequency and high slew rate (dv/dt) switching modes, and provides additional flexibility for programming the desired turn-on slew rate of the device.

To further improve upon this design, it is desirable to use this device in a floating high-side configuration while still driving the device from a standard low-side referenced PWM signal. Existing solutions, such as that illustrated in FIG. 2 require an additional high-side driver IC or half-bridge driver IC to voltage shift the PWM signal from the low-side, across the isolation or high-voltage barrier, to the high-side. Such solutions, however, have frequency limitations, have propagation delay limitations, consume high currents, require additional PCB footprint area, and are costly. A new solution is needed that is simple and reliable, runs at high-speeds and low propagation delays, and easy to integrate into an existing GaN power FET and gate driver monolithic circuit.

BRIEF SUMMARY OF THE INVENTION

One general aspect includes a power drive circuit, including: a pulse detector, configured to receive first and second pulse signals and to generate first and second control signals in response to the first and second pulse signals, respectively. The power drive circuit also includes a state storage device, configured to receive the first and second control signals and to generate first and second driver input signals in response to the first and second control signals, respectively, where the state storage device is configured to generate the first driver input signal in response to the first control signal and to maintain the first driver input signal until receiving the second control signal despite no longer receiving the first control signal, where the state storage device is configured to generate the second driver input signal in response to the second control signal and to maintain the second driver input signal until receiving the first control signal despite no longer receiving the second control signal. The power drive circuit also includes a driver configured to receive the first and second driver input signals and to generate first and second gate drive signals in response to the first and second driver input signals, respectively. The power drive circuit also includes a power switch, configured to receive the first and second gate drive signals, where the first and second gate drive signals control the power switch to selectively conduct or not conduct current between first and second terminals.

Implementations may include one or more of the following features. The power drive circuit where the pulse detector is configured to receive the first and second pulse signals from a transformer. The power drive circuit where a primary inductor of the transformer is configured to receive a pulse width modulation (PWM) signal, and a secondary inductor of the transformer is configured to generate the first and second pulse signals in response to the PWM signal. The power drive circuit where in response to a rising edge at the primary inductor, the secondary inductor generates a positive going pulse which causes the power switch to be conductive. The power drive circuit where the state storage device includes a capacitor. The power drive circuit where the state storage device includes a latch. The power drive circuit further including an overcurrent protection circuit, configured to cause the power switch to be nonconductive in response to an overcurrent condition. The power drive circuit where the overcurrent protection circuit is configured to sense the overcurrent condition by comparing a voltage based on a voltage difference between the first and second terminals with a threshold voltage. The power drive circuit where the pulse detector, the state storage device, the driver, and the power switch are integrated on a single GaN die. The power drive circuit where one or more of the pulse detector, the state storage device, the driver, and the power switch are integrated on a first GaN die, and the remainder of the pulse detector, the state storage device, the driver, and the power switch are integrated on a second GaN die.

One general aspect includes a power circuit, including: first and second power drive circuits, each configured to receive a plurality of pulse signals from a pulse generator, where each of the first and second power drive circuits includes: The power circuit also includes a pulse detector, configured to receive first and second pulse signals and to generate first and second control signals in response to the first and second pulse signals, respectively. The power circuit also includes a state storage device, configured to receive the first and second control signals and to generate first and second driver input signals in response to the first and second control signals, respectively, where the state storage device is configured to generate the first driver input signal in response to the first control signal and to maintain the first driver input signal until receiving the second control signal despite no longer receiving the first control signal, where the state storage device is configured to generate the second driver input signal in response to the second control signal and to maintain the second driver input signal until receiving the first control signal despite no longer receiving the second control signal. The power circuit also includes a driver configured to receive the first and second driver input signals and to generate first and second gate drive signals in response to the first and second driver input signals, respectively. The power circuit also includes a power switch, configured to receive the first and second gate drive signals, where the first and second gate drive signals control the power switch to selectively conduct or not conduct current between first and second terminals.

Implementations may include one or more of the following features. The power circuit where the pulse detector of each power drive circuit is configured to receive the first and second pulse signals from a transformer. The power circuit where a primary inductor of the transformer is configured to receive a pulse width modulation (PWM) signal, and the secondary inductor of the transformer is configured to generate the first and second pulse signals in response to the PWM signal. The power circuit where in response to a rising edge at the primary inductor, the secondary inductor generates a positive going pulse which causes the power switch of each power drive circuit to be conductive. The power circuit where the state storage device of each power drive circuit includes a capacitor. The power circuit where the state storage device of each power drive circuit includes a latch. The power circuit where each power drive circuit further includes an overcurrent protection circuit, configured to cause the power switch to be nonconductive in response to an overcurrent condition. The power circuit where the overcurrent protection circuit of each power drive circuit is configured to sense the overcurrent condition by comparing a voltage based on a voltage difference between the first and second terminals with a threshold voltage. The power circuit where the pulse detector, the state storage device, the driver, and the power switch circuit of each power drive circuit are integrated on a single GaN die. The power circuit where one or more of the pulse detector, the state storage device, the driver, and the power switch are integrated on a first GaN die, and the remainder of the pulse detector, the state storage device, the driver, and the power switch are integrated on a second GaN die.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein. Modifications can be made to the discussed embodiments by those skilled in the art without departing from the invention. Therefore, the invention is not limited to particular embodiments disclosed herein.

Figure 1:
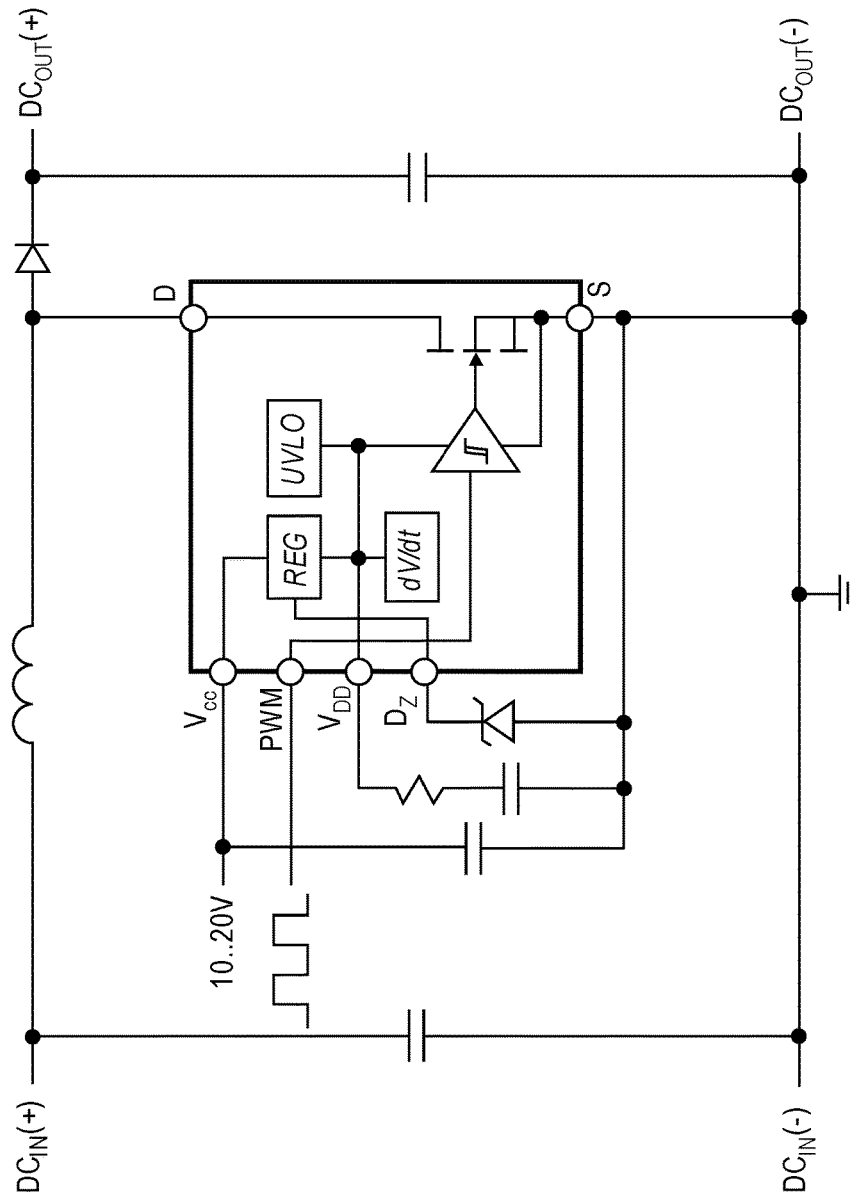
FIG. 1 is a schematic diagram of a prior art power control circuit.
Figure 2:
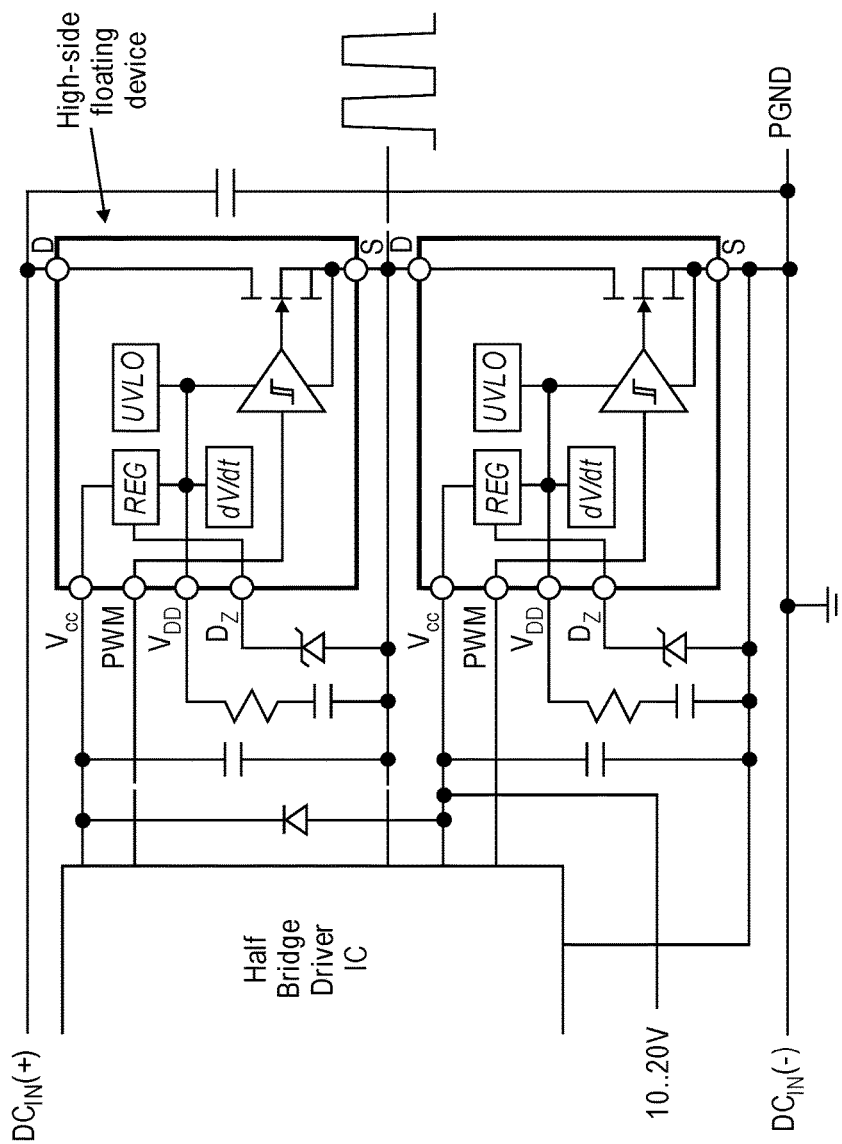
FIG. 2 is a schematic diagram of a prior art power control circuit.
Figure 3:
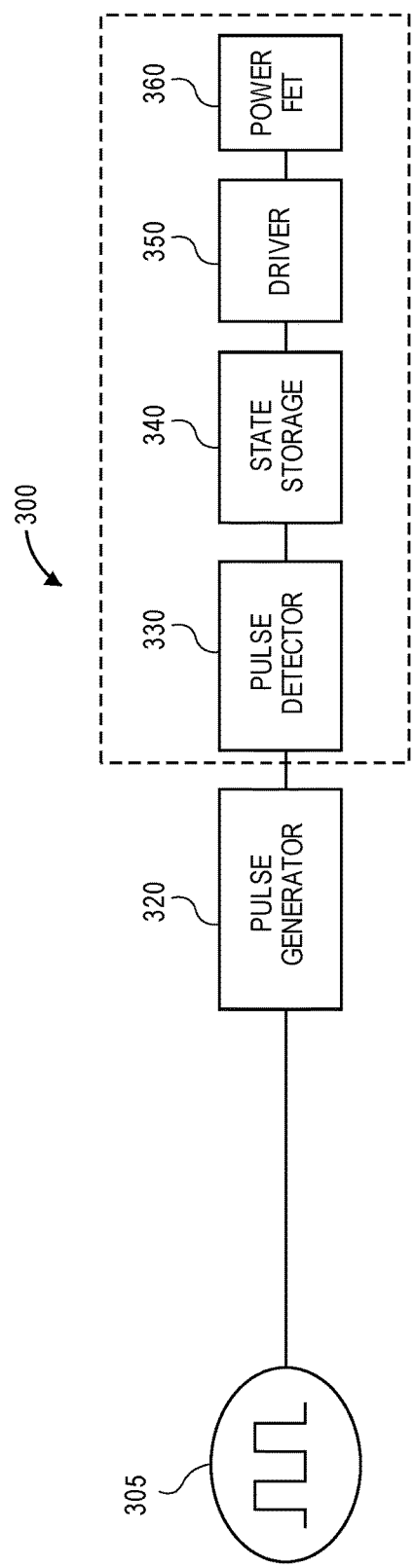
FIG. 3 is a schematic diagram of a power drive circuit having an integrated gate drive circuit and GaN power FET, according to an embodiment.

FIG. 3 is a schematic diagram of a power circuit 300 having an integrated gate drive circuit and power switch, such as a GaN power FET, according to an embodiment. Power circuit 300 receives a pulse signal from pulse generator 320, which is configured to generate pulses in response to a signal from signal source 305. Signal source 305 may, for example, be a PWM signal source. Power circuit 300 includes pulse detector 330, state storage device 340, driver 350, and power FET 360. In some embodiments, a single circuit incorporates any two or more of generator 320, pulse detector 330, state storage device 340, driver 350, and power FET 360.

In some embodiments, the power FET 360 is integrated on the same die as the pulse detector 330, the state storage device 340, and the driver 350. In some embodiments, the power FET 360 is not integrated on the same die as a die on which the pulse detector 330, the state storage device 340, and the driver 350 are integrated. In some embodiments, one or more of the pulse detector 330, the state storage device 340, the driver 350, and the power FET 360 are integrated on a first GaN die, and the remainder of the pulse detector 330, the state storage device 340, the driver 350, and the power FET 360 are integrated on a second GaN die.

Pulse generator 320 receives a signal from signal source 305, and generates pulses based on the received signal. For example, the signal received from signal source 305 may be a PWM signal having a duty cycle corresponding with a desired on time duty cycle of power FET 360. Pulse generator 320 may be configured to generate pulses in response to the received signal. For example, in some embodiments, pulse generator 320 generates a positive going pulse in response to each rising edge of the signal received from signal source 305 and generates a negative going pulse in response to each falling edge of the signal received from signal source 305. In alternative embodiments, pulse generator 320 generates a negative going pulse in response to each rising edge of the signal received from signal source 305 and generates a positive going pulse in response to each falling edge of the signal received from signal source 305. Other pulses corresponding the received signal may alternatively be generated by pulse generator 320 in response to receiving the received signal.

In some embodiments, pulse generator 320 also performs a level shifting function. For example, the signal from signal source 305 may be referenced to a first supply voltage, and the positive and negative going pulses generated by pulse generator 320 may be referenced to a second supply voltage. For example, the second supply voltage may be a floating supply voltage. In such embodiments, the positive going pulse may be positive with respect to the floating supply voltage, and the negative going pulse may be negative with respect to the floating supply voltage.

Pulse detector 330 receives the pulses generated by pulse generator 320 and generates one or more signals corresponding with the received pulses. For example, pulse detector 330 may be configured to generate a first type of signal in response to the positive going pulses generated by pulse generator 320 and to generate a second type of signal in response of negative going pulses generated by pulse generator 320. In some embodiments, the first type of signal includes a positive pulse referenced to the second supply voltage on a first conductor, and the second type of signal includes a positive pulse referenced to the second supply voltage on a second conductor. In some embodiments, other types of signals are used.

In response to receiving no pulse from pulse generator 320, pulse detector 330 may be configured to generate a neutral signal which is different from either of the first and second types of signals.

State storage device 340 receives the one or more signals generated by the pulse detector 330. In response to the received signals, state storage device 340 generates an input for driver 350.

For example, the state storage device 340 may receive a signal of the first type from pulse detector 330, and in response to the received signal of the first type, the state storage device 340 may generate an input for driver 350 which causes driver 350 to turn on power FET 360. The state storage device 340 may be configured to continuously generate the input for driver 350 which causes power FET 360 to be on until state storage device 340 receives a signal of the second type from pulse detector 330.

Accordingly, in response to receiving a signal of the first type from pulse detector 330, state storage device 340 generates an input for driver 350 which causes driver 350 to turn on power FET 360. At the conclusion of the received signal of the first type from pulse detector 330, pulse detector 330 generates a neutral signal. In response to the neutral signal, state storage device 340 continues to generate the input for driver 350 which causes driver 352 turn on power FET 360.

State storage device 340 may receive a signal of the second type from pulse detector 330, and in response to the received signal of the second type, the state storage device 340 may generate an input for driver 350 which causes driver 350 to turn on power FET 360. The state storage device 340 may be configured to continuously generate the input for driver 350 which causes power FET 360 to be off until state storage device 340 receives a signal of the first type from pulse detector 330.

Accordingly, in response to receiving a signal of the second type from pulse detector 330, state storage device 340 generates an input for driver 350 which causes driver 350 to turn off power FET 360. At the conclusion of the received signal of the second type from pulse detector 330, pulse detector 330 generates a neutral signal. In response to the neutral signal, state storage device 340 continues to generate the input for driver 350 which causes driver 352 turn off power FET 360.

Driver 350 is configured to receive the signals from state storage device 340 and to cause power FET 360 to be conductive (on) or nonconductive (off) according to the received signal from state storage device 340.

Figure 4:
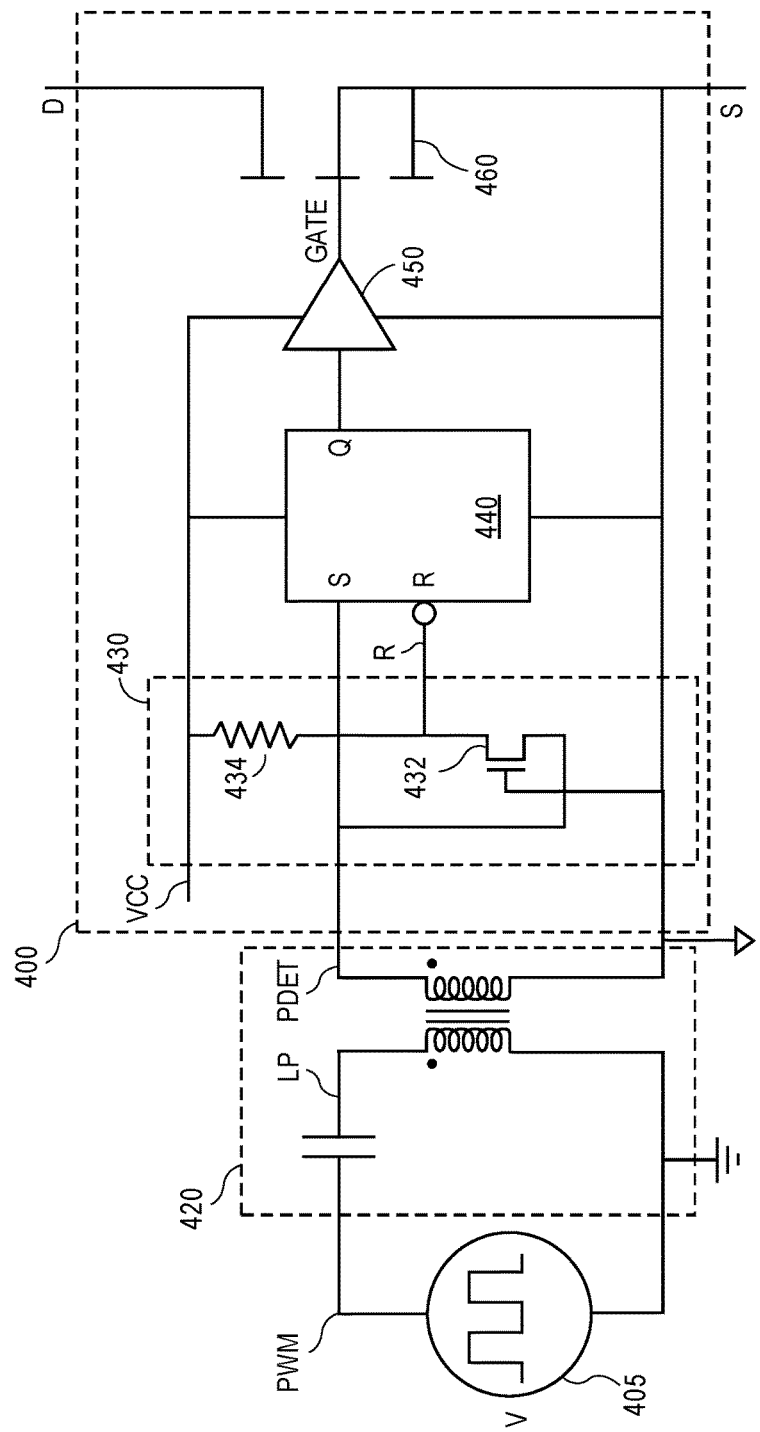
FIG. 4 is a schematic diagram of a power drive circuit having an integrated gate drive circuit and GaN power FET, according to another embodiment.

FIG. 4 includes a schematic diagram of a circuit 400 having an integrated gate drive circuit and GaN power FET, according to another embodiment. In FIG. 4, circuit 400 receives a pulse signal from pulse generator 420, which is configured to generate pulses in response to a signal from signal source 405. Signal source 405 may, for example, be a PWM signal source. Power circuit 400 includes pulse detector 430, state storage device 440, driver 450, and a power switch, such as power FET 460.

In some embodiments, the power FET 460 is integrated on the same die as the pulse detector 430, the state storage device 440, and the driver 450. In some embodiments, the power FET 460 is not integrated on the same die as a die on which the pulse detector 430, the state storage device 440, and the driver 450 are integrated. In some embodiments, one or more of the pulse detector 430, the state storage device 440, the driver 450, and the power FET 460 are integrated on a first GaN die, and the remainder of the pulse detector 430, the state storage device 440, the driver 450, and the power FET 460 are integrated on a second GaN die.

Pulse generator 420 receives a signal from signal source 405, and generates pulses based on the received signal. For example, the signal received from signal source 405 may be a PWM signal having a duty cycle corresponding with a desired on time duty cycle of power FET 460. Pulse generator 420 may be configured to generate pulses in response to the received signal. In this embodiment, the capacitor and transformer of pulse generator 420 are sized such that the pulse generator 420 is effectively edge triggered, such that each rising or falling edge of the PWM signal causes pulse generator 420 to generate a pulse. For example, in this embodiment, pulse generator 420 generates a positive going pulse at node PDET in response to each rising edge of the signal received from signal source 405 and generates a negative going pulse at node PDET in response to each falling edge of the signal received from signal source 405.

In this embodiment, pulse generator 420 also performs a level shifting function. As indicated, the signal from signal source 405 is referenced to a first supply voltage, and the positive and negative going pulses generated by pulse generator 420 are referenced to a second supply voltage. For example, the second supply voltage may be a floating supply voltage. In this embodiment, the positive going pulses are positive with respect to the floating supply voltage, and the negative going pulses are negative with respect to the floating supply voltage.

Pulse detector 430 receives the pulses generated by pulse generator 420 and generates one or more signals corresponding with the received pulses. For example, in this embodiment, pulse detector 430 is configured to generate or pass a positive going pulse for the set input S of state storage latch 440 in response to the positive going pulses generated by pulse generator 420. As shown in the embodiment of FIG. 4, the pulses generated by pulse generator 420 are not rectified, so that the pulse detector receives unrectified pulses generated by pulse generator 420.

In addition, in this embodiment, pulse detector 430 is configured to generate a negative going pulse for the reset input R of state storage latch 440 in response of negative going pulses generated by pulse generator 420. As understood by those of skill in the art, pulse detector 430 generates the negative going pulse for the reset input R of state storage latch 440 because the negative going pulse from pulse generator 420 turns on transistor 432, which pulls down the voltage at the reset input R of state storage latch 440, which was previously held high by resistor 434. In addition, once the negative going pulse from pulse register 420 has passed, transistor 432 turns off, and resistor 434 again pulls up the voltage at the reset input R of state storage latch 440.

State storage latch 440 receives the one or more signals from the pulse detector 430. In response to the received signals, state storage device 440 generates an input for driver 450. In the embodiment of FIG. 4, state storage device 440 is a latch. In some embodiments, state storage device 440 is a digital latch. In alternative embodiments, state storage device 440 includes a capacitor conditionally driven to a state corresponding to a desired conductivity state of FET 460 by a circuit configured to generate the desired capacitor voltage state based on one or more signals from the pulse detector 430 and configured to have a selectively tri-stateable output, such that the capacitor voltage state may be selectively maintained in response to the one or more signals from the pulse detector 430.

For example, a positive going pulse for the set input S of state storage latch 440 from pulse detector 430 causes state storage latch 440 to generate a high-voltage at its Q output, connected to the input of driver 450. In addition, a negative going pulse for the reset input R of state storage latch 440 from pulse detector 430 causes state storage latch 440 to generate a low-voltage at its Q output, connected to the input of driver 450.

Driver 450 is configured to receive the signals from state storage device 440 and to cause power FET 460 to be conductive or substantially nonconductive according to the received signal from state storage latch 440.

As shown in FIG. 4, the circuit 400 receives a single-ended pulse signal from pulse generator 420, and the processing of the single-ended pulse signal by circuit 400 is also single-ended.

Additionally, because the circuitry between the PWM signal input and the power FET 460 is simple, has few stages, has low capacitance, can have a digital latch, has single-ended operation, and needs no rectification, the propagation delay between the PWM signal input and the gate of the power FET 460 is low. For example, the propagation delay may be less than about 10 ns, about 7 ns, about 5 ns, about 4 ns, about 3 ns, about 2 ns, about 1 ns, or lower. This allows the circuit 400 to operate at a frequencies corresponding to the minimal propagation delay.

Figure 5:
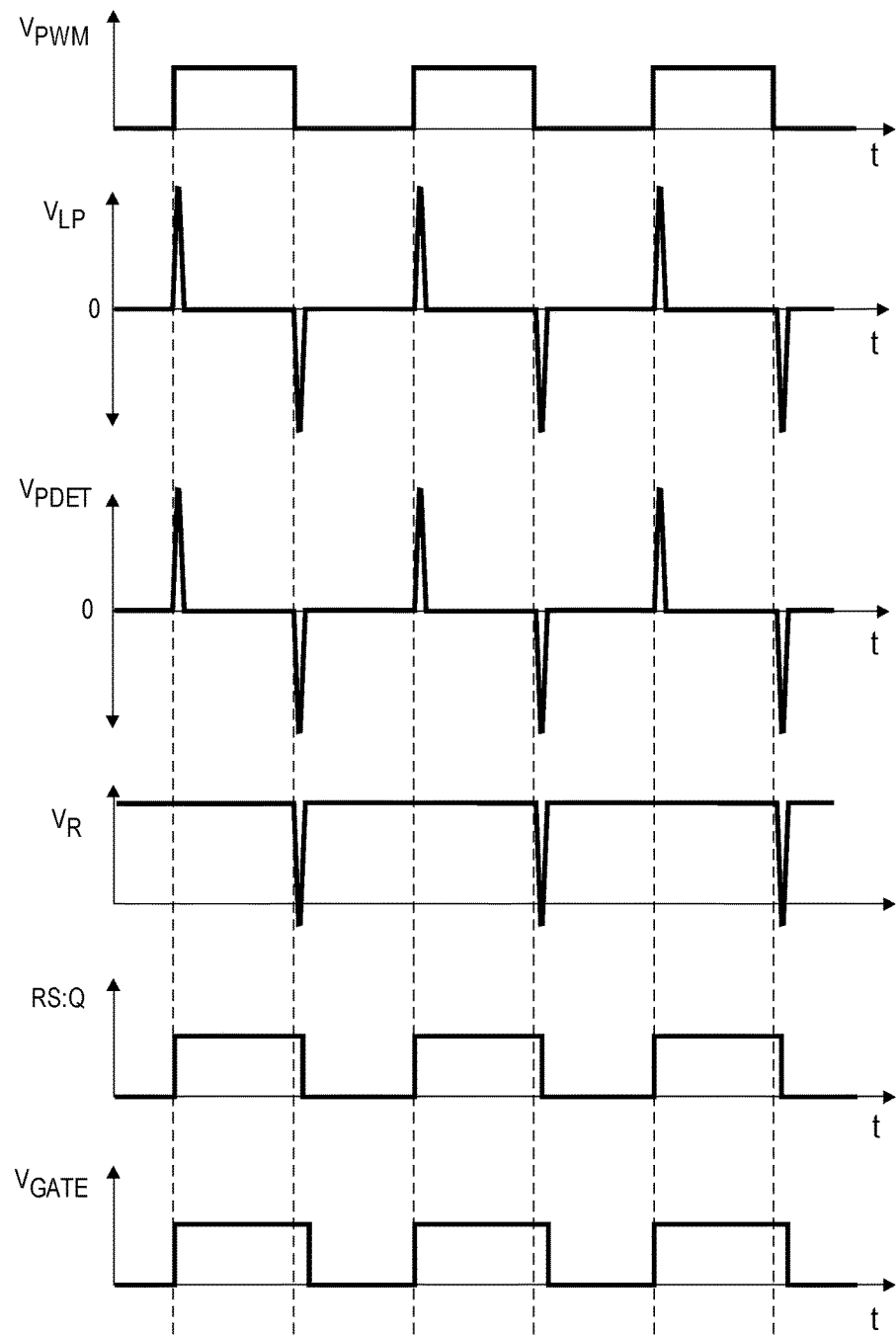
FIG. 5 is a waveform diagram illustrating the operation of the embodiment of FIG. 4.

Accordingly, as shown in FIG. 5, in response to each rising edge at node PWM, a rising edge at node LP is generated. In response to the rising edge at node LP, a rising edge at node PDET is generated. In addition, in response to the rising edge at node PDET, the Q output of state storage latch 440 rises, and driver 450 causes the gate voltage of power FET 460 to rise. Consequently, in response to each rising edge at node PWM, power FET turns on, and becomes conductive.

In addition, as shown in FIG. 5, in response to each falling edge at node PWM, a falling edge at node LP is generated. In response to the falling edge at node LP, a falling edge at node R is generated. In addition, in response to the falling edge at node R, the Q output of state storage latch 440 falls, and driver 450 causes the gate voltage of power FET 460 to fall. Consequently, in response to each falling edge at node PWM, power FET turns off, and becomes substantially nonconductive.

Figure 6:
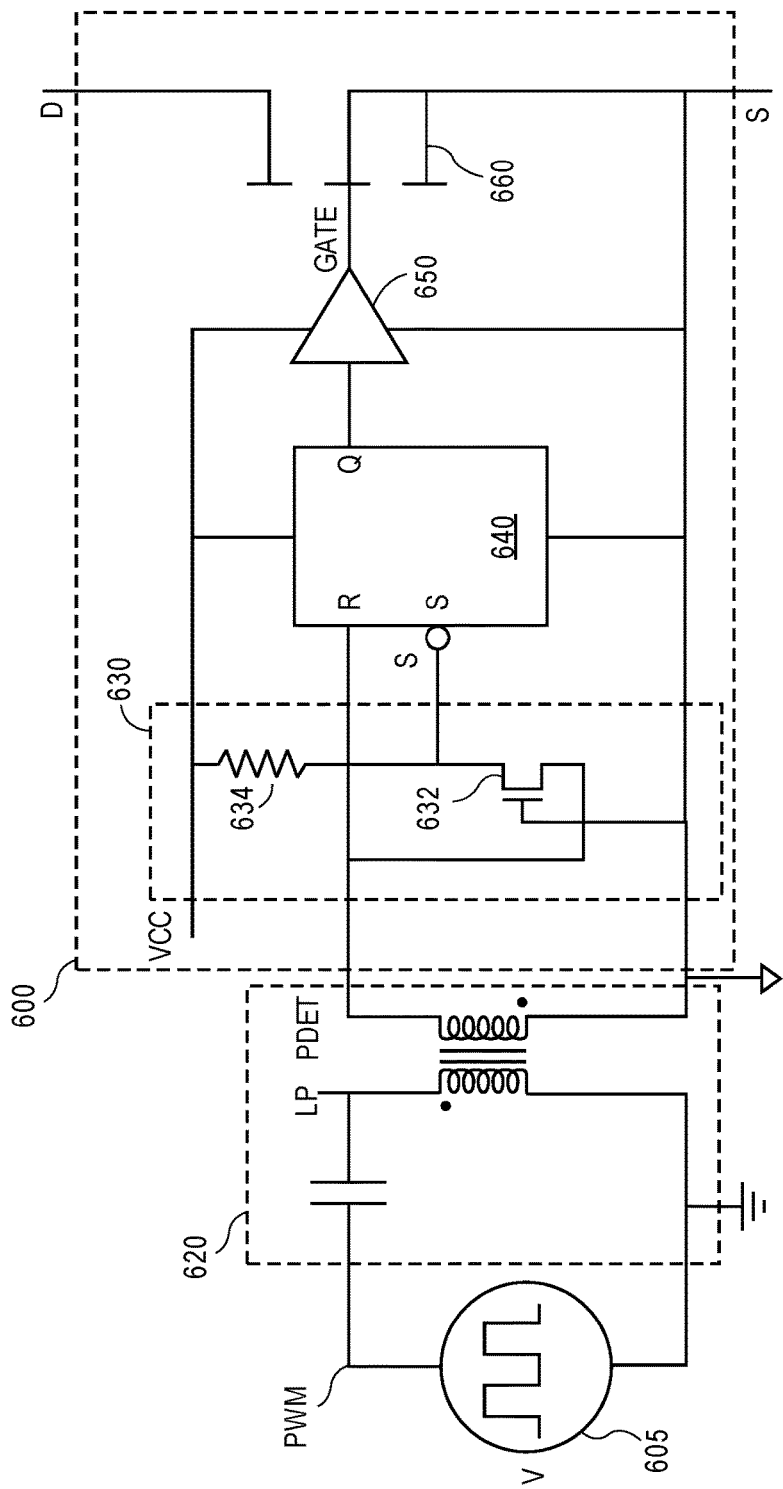
FIG. 6 is a schematic diagram of a power drive circuit having an integrated gate drive circuit and GaN power FET, according to another embodiment.

FIG. 6 includes a schematic diagram of a circuit 600 having an integrated gate drive circuit and GaN power FET, according to another embodiment. In FIG. 6, circuit 600 receives a pulse signal from pulse generator 620, which is configured to generate pulses in response to a signal from signal source 605. Signal source 605 may, for example, be a PWM signal source. Power circuit 600 includes pulse detector 630, state storage device 640, driver 650, and a power switch, such as power FET 660.

In some embodiments, the power FET 660 is integrated on the same die as the pulse detector 630, the state storage device 640, and the driver 650. In some embodiments, the power FET 660 is not integrated on the same die as a die on which the pulse detector 630, the state storage device 640, and the driver 650 are integrated. In some embodiments, one or more of the pulse detector 630, the state storage device 640, the driver 650, and the power FET 660 are integrated on a first GaN die, and the remainder of the pulse detector 630, the state storage device 640, the driver 650, and the power FET 660 are integrated on a second GaN die.

Pulse generator 620 receives a signal from signal source 605, and generates pulses based on the received signal. For example, the signal received from signal source 605 may be a PWM signal having a duty cycle corresponding with a desired on time duty cycle of power FET 660. Pulse generator 620 may be configured to generate pulses in response to the received signal. In this embodiment, the capacitor and transformer of pulse generator 620 are sized such that the pulse generator 620 is effectively edge triggered, such that each rising or falling edge of the PWM signal causes pulse generator 620 to generate a pulse. For example, in this embodiment, pulse generator 620 generates a negative going pulse at node R in response to each rising edge of the signal received from signal source 605 and generates a positive going pulse at node PDET in response to each falling edge of the signal received from signal source 605.

In this embodiment, pulse generator 620 also performs a level shifting function. As indicated, the signal from signal source 605 is referenced to a first supply voltage, and the positive and negative going pulses generated by pulse generator 620 are referenced to a second supply voltage. For example, the second supply voltage may be a floating supply voltage. In this embodiment, the positive going pulses are positive with respect to the floating supply voltage, and the negative going pulses are negative with respect to the floating supply voltage.

Pulse detector 630 receives the pulses generated by pulse generator 620 and generates one or more signals corresponding with the received pulses. For example, in this embodiment, pulse detector 630 is configured to generate or pass a positive going pulse for the reset input R of state storage latch 640 in response to the positive going pulses generated by pulse generator 620. As shown in the embodiment of FIG. 6, the pulses generated by pulse generator 620 are not rectified, so that the pulse detector receives unrectified pulses generated by pulse generator 620.

In addition, in this embodiment, pulse detector 630 is configured to generate a negative going pulse for the set input S of state storage latch 640 in response of negative going pulses generated by pulse generator 620. As understood by those of skill in the art, pulse detector 630 generates the negative going pulse for the set input S of state storage latch 640 because the negative going pulse from pulse generator 620 turns on transistor 632, which pulls down the voltage at the set input S of state storage latch 640, which was previously held high by resistor 634. In addition, once the negative going pulse from pulse register 620 has passed, transistor 632 turns off, and resistor 634 again pulls up the voltage at the set input S of state storage latch 640.

State storage latch 640 receives the one or more signals from the pulse detector 630. In response to the received signals, state storage device 640 generates an input for driver 650. In the embodiment of FIG. 6, state storage device 640 is a latch. In some embodiments, state storage device 640 is a digital latch. In alternative embodiments, state storage device 640 includes a capacitor conditionally driven to a state corresponding to a desired conductivity state of FET 660 by a circuit configured to generate the desired capacitor voltage state based on one or more signals from the pulse detector 630 and configured to have a selectively tri-state-able output, such that the capacitor voltage state may be selectively maintained in response to the one or more signals from the pulse detector 630.

For example, a negative going pulse for the set input S of state storage latch 640 from pulse detector 630 causes state storage latch 640 to generate a high-voltage at its Q output, connected to the input of driver 650. In addition, a positive going pulse for the reset input R of state storage latch 640 from pulse detector 630 causes state storage latch 640 to generate a low-voltage at its Q output, connected to the input of driver 650.

Driver 650 is configured to receive the signals from state storage device 640 and to cause power FET 660 to be conductive or nonconductive according to the received signal from state storage latch 640.

Additionally, because the circuitry between the PWM signal input and the power FET 660 is simple, has few stages, has low capacitance, can have a digital latch, has single-ended operation, and needs no rectification, the propagation delay between the PWM signal input and the gate of the power FET 460 is low. For example, the propagation delay may be less than about 10 ns, about 7 ns, about 5 ns, about 4 ns, about 3 ns, about 2 ns, about 1 ns, or lower. This allows the circuit 600 to operate at a frequencies corresponding to the minimal propagation delay.

Figure 7:
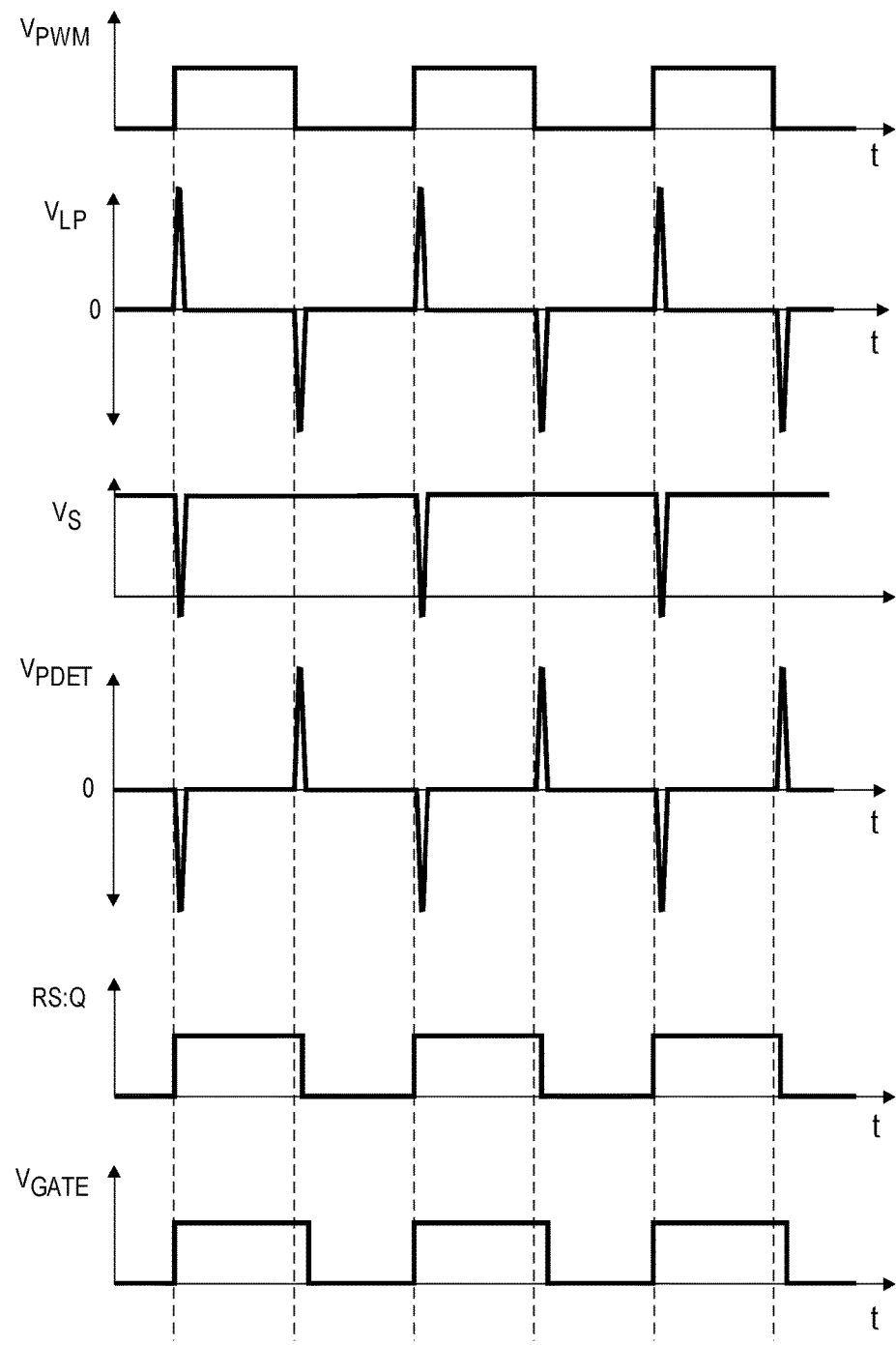
FIG. 7 is a waveform diagram illustrating the operation of the embodiment of FIG. 6.

Accordingly, as shown in FIG. 7, in response to each rising edge at node PWM, a rising edge at node LP is generated. In response to the rising edge at node LP, a falling edge at node PDET is generated. In addition, in response to the falling edge at node PDET, a falling edge at node S is generated. In response to the falling edge at node S, the Q output of state storage latch 640 rises, and driver 650 causes the gate voltage of power FET 660 to rise. Consequently, in response to each rising edge at node PWM, power FET turns on, and becomes conductive.

As shown in FIG. 7, the circuit 600 receives a single-ended pulse signal from pulse generator 620, and the processing of the single-ended pulse signal by circuit 600 is also single-ended.

In addition, as shown in FIG. 7, in response to each falling edge at node PWM, a falling edge at node LP is generated. In response to the falling edge at node LP, a rising edge at node PDET is generated. In addition, in response to the rising edge at node PDET, the Q output of state storage latch 640 falls, and driver 650 causes the gate voltage of power FET 660 to fall. Consequently, in response to each falling edge at node PWM, power FET turns off, and becomes substantially nonconductive.

Figure 8:
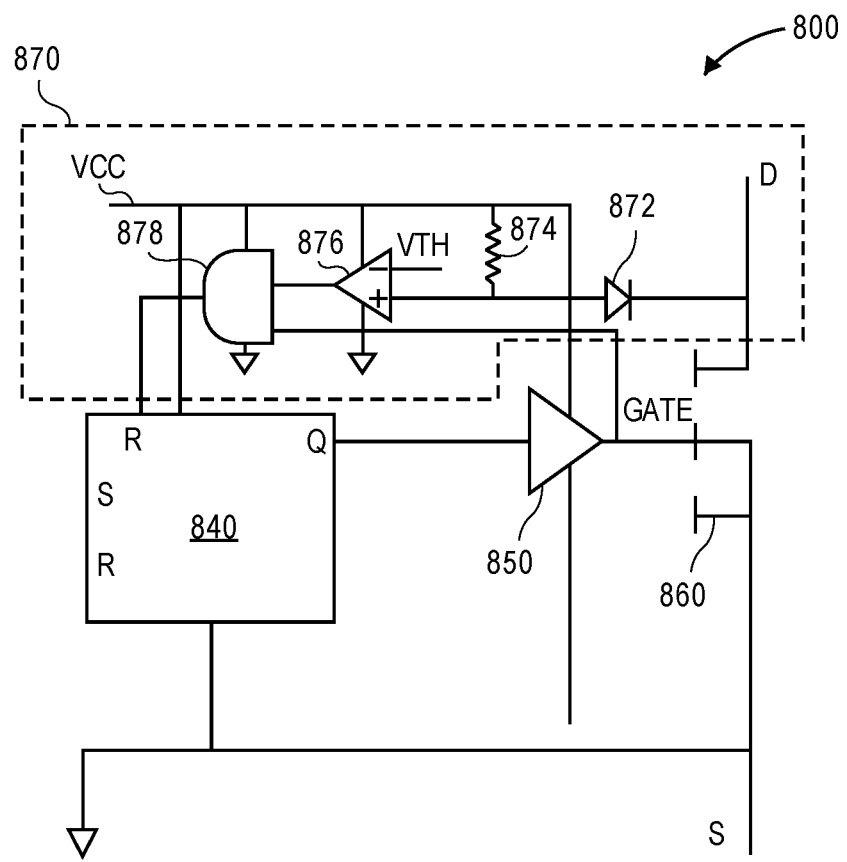
FIG. 8 is a schematic diagram illustrating a portion of a power drive circuit having a overcurrent protection circuit.

FIG. 8 is a schematic diagram illustrating a portion of a power drive circuit 800 having a overcurrent protection circuit 870. Power drive circuit 800 includes state storage device 840, driver 850, and power FET 860, which each have features similar or identical to state storage devices, drivers, and power FETs discussed elsewhere herein, and which may be used in power drive circuits such as those discussed above with reference to FIGS. 4 and 6.

Overcurrent protection circuit 870 includes diode 872, resistor 874, comparator 876, and AND gate 878.

Diode 872 and resistor 874 cooperatively generate a voltage for comparator 876 based on the voltage at nodes VCC and D. Comparator 876 generates a voltage for AND gate 878 based on the voltage cooperatively generated by diode 872 and resistor 874 and based on the threshold voltage at node VTH. The AND gate 878 conditionally resets stage storage latch 840 based on the voltage generated by comparator 876 and the voltage at node GATE.

If the voltage at gate node GATE of FET 860 is high, causing FET 860 to be conductive, and the voltage at the drain node D of FET 860 is greater than a threshold, and overcurrent condition exists. In response to the voltage at the drain node D of FET 860 being greater than the threshold, the voltage at the positive input of comparator 876 exceeds the voltage at the negative input of comparator 876. Consequently, the voltage generated by comparator 876 for AND gate 878 is high. In response to the voltage at gate node GATE of FET 860 additionally being high, the output of AND gate 878 is driven high, and state storage latch 840 is reset, causing the voltage at gate node GATE of FET 860 to be low, resulting in FET 860 being turned off.

Because the voltage at gate node GATE of FET 860 is low, the output of AND gate 878 returns to a low state, such that state storage latch 840 may be subsequently set by other circuitry of the power drive circuit 800 not shown in FIG. 8. Accordingly, overcurrent protection is provided cycle by cycle, such that if an overcurrent protection condition occurs, FET 860 is turned off to stop the overcurrent protection condition, and FET 860 may be subsequently turned on at the next board a next cycle according to the functionality of circuitry described, for example, with reference to FIGS. 4 and 6.

Using this overcurrent protection circuitry, provides for fast detection, and removes the need for an external current sensing resistor and for an external detection circuit. Additionally, in half bridge applications, the disclosed overcurrent protection circuitry provides protection against shoot-through fault conditions.

In some embodiments, AND gate 878 is not used, and state storage latch 840 is reset in response to a signal from comparator 876.

Figure 9:
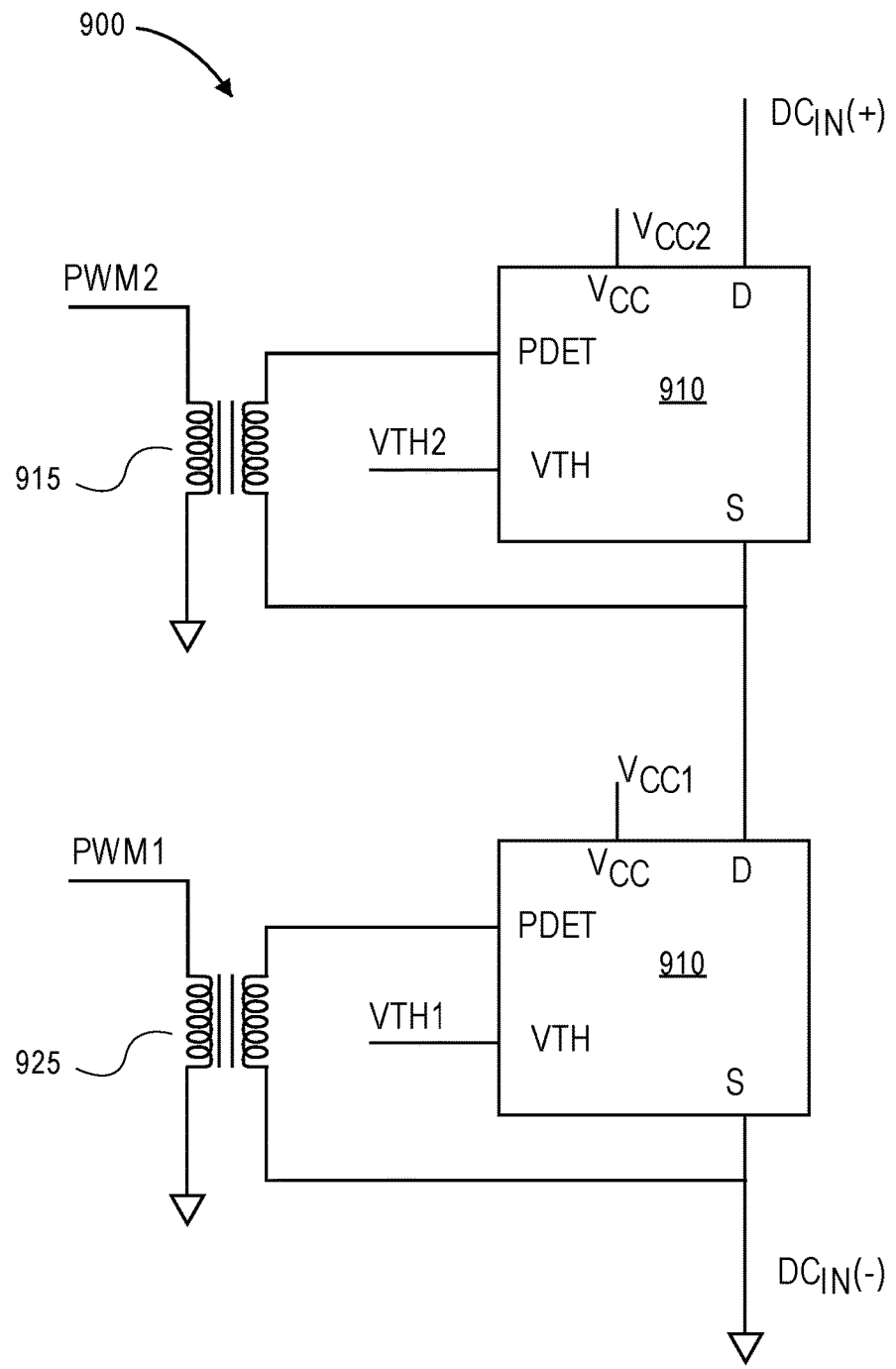
FIG. 9 is a schematic diagram illustrating a half-bridge circuit using highside and lowside power drive circuits.

FIG. 9 is a schematic diagram illustrating a half-bridge circuit 900 using highside and lowside power drive circuits 910 and 920.

Highside and lowside power drive circuits 910 and 920 may, for example, have aspects similar or identical to power drive circuits 300, 400, and 600 discussed herein. Additionally, in some embodiments highside and lowside power drive circuits 910 and 920 have aspects similar or identical to power drive circuit 800 discussed herein.

As indicated in FIG. 9, highside power drive circuit 910 receives input pulses at its PDET input which are generated by transformer 915 in response to a PWM signal at input PWM2. Likewise, low side power drive circuit 920 receives input pulses at its PDET input which are generated by transformer 925 in response to a PWM signal at input PWM1. The PWM signals at input PWM1 and PWM2 are inverted with respect to one another, and, in some embodiments, are nonoverlapping.

In some embodiments, highside and lowside power drive circuits 910 and 920 are each integrated within a single package. In some embodiments, highside and lowside power drive circuits 910 and 920 are both integrated within a single package. In some embodiments, highside and lowside power drive circuits 910 and 920 are each integrated on a single die, such as a GaN die, within a package. In some embodiments, highside and lowside power drive circuits 910 and 920 are both integrated on a single die, such as a GaN die, within a package.

In some embodiments, lowside power drive circuit 910 receives input pulses at its PDET input from a PWM signal source which does not include a transformer.

Though the present invention is disclosed by way of specific embodiments as described above, those embodiments are not intended to limit the present invention. Based on the methods and the technical aspects disclosed above, variations and changes may be made to the presented embodiments by those skilled in the art without departing from the spirit and the scope of the present invention.

What is claimed is:

1. A power drive circuit, comprising:
 a transformer, configured to generate first and second pulse signals;

a pulse detector, configured to receive the first and second pulse signals and to generate first and second control signals in response to the first and second pulse signals, respectively;

a state storage device, configured to receive the first and second control signals and to generate first and second driver input signals in response to the first and second control signals, respectively, wherein the state storage device is configured to generate the first driver input signal in response to the first control signal and to maintain the first driver input signal until receiving the second control signal despite no longer receiving the first control signal, wherein the state storage device is configured to generate the second driver input signal in response to the second control signal and to maintain the second driver input signal until receiving the first control signal despite no longer receiving the second control signal;

a driver configured to receive the first and second driver input signals and to generate first and second gate drive signals in response to the first and second driver input signals, respectively; and a power switch, configured to receive the first and second gate drive signals, wherein the first and second gate drive signals control the power switch to selectively conduct or not conduct current between first and second terminals, wherein the first gate drive signal causes the power switch to conduct and the second gate drive signal causes the power switch to not conduct, wherein the first and second control signals having a low logic state causes the state storage device to generate the first driver input signal.

2. The power drive circuit of claim 1, wherein the transformer is configured to respectively generate the first and second pulses in response to rising and falling edges of a transformer input signal applied to the primary side of the transformer.

3. The power drive circuit of claim 1, wherein a primary inductor of the transformer is configured to receive a pulse width modulation (PWM) signal, and a secondary inductor of the transformer is configured to generate the first and second pulse signals in response to the PWM signal.

4. The power drive circuit of claim 3, wherein in response to a rising edge at the primary inductor, the secondary inductor generates a negative going pulse which causes the power switch to be conductive.

5. The power drive circuit of claim 1, wherein the state storage device comprises a capacitor.

6. The power drive circuit of claim 1, wherein the state storage device comprises a latch.

7. The power drive circuit of claim 1, further comprising an overcurrent protection circuit, configured to cause the power switch to be nonconductive in response to an overcurrent condition.

8. The power drive circuit of claim 7, wherein the overcurrent protection circuit is configured to sense the overcurrent condition by comparing a voltage based on a voltage difference between the first and second terminals with a threshold voltage.

9. The power drive circuit of claim 1, wherein the pulse detector, the state storage device, the driver, and the power switch are integrated on a single GaN die.

10. A power circuit, comprising:

first and second power drive circuits, each configured to receive a plurality of pulse signals from a pulse generator, wherein each of the first and second power drive circuits comprises:

a transformer, configured to generate first and second pulse signals;

a pulse detector, configured to receive first and second pulse signals and to generate first and second control signals in response to the first and second pulse signals, respectively, a state storage device, configured to receive the first and second control signals and to generate first and second driver input signals in response to the first and second control signals, respectively, wherein the state storage device is configured to generate the first driver input signal in response to the first control signal and to maintain the first driver input signal until receiving the second control signal despite no longer receiving the first control signal, wherein the state storage device is configured to generate the second driver input signal in response to the second control signal and to maintain the second driver input signal until receiving the first control signal despite no longer receiving the second control signal, a driver configured to receive the first and second driver input signals and to generate first and second gate drive signals in response to the first and second driver input signals, respectively, and a power switch, configured to receive the first and second gate drive signals, wherein the first and second gate drive signals control the power switch to selectively conduct or not conduct current between first and second terminals, wherein the first gate drive signal causes the power switch to conduct and the second gate drive signal causes the power switch to not conduct, wherein the first and second control signals having a low logic state causes the state storage device to generate the first driver input signal.

11. The power circuit of claim 10, wherein the transformer is configured to respectively generate the first and second pulses in response to rising and falling edges of a transformer input signal applied to the primary side of the transformer.

12. The power circuit of claim 10, wherein a primary inductor of the transformer is configured to receive a pulse width modulation (PWM) signal, and the secondary inductor of the transformer is configured to generate the first and second pulse signals in response to the PWM signal.

13. The power circuit of claim 12, wherein in response to a rising edge at the primary inductor, the secondary inductor generates a negative going pulse which causes the power switch of each power drive circuit to be conductive.

14. The power circuit of claim 10, wherein the state storage device of each power drive circuit comprises a capacitor.

15. The power circuit of claim 10, wherein the state storage device of each power drive circuit comprises a latch.

16. The power circuit of claim 10, wherein each power drive circuit further comprises an overcurrent protection circuit, configured to cause the power switch to be nonconductive in response to an overcurrent condition.

17. The power circuit of claim 16, wherein the overcurrent protection circuit of each power drive circuit is configured to sense the overcurrent condition by comparing a voltage based on a voltage difference between the first and second terminals with a threshold voltage.

18. The power circuit of claim 10, wherein the pulse detector, the state storage device, the driver, and the power switch circuit of each power drive circuit are integrated on a single GaN die.

* * * * *